(12) United States Patent
Ikarashi

(10) Patent No.: US 10,181,345 B2
(45) Date of Patent: Jan. 15, 2019

(54) MEMORY MANAGEMENT DEVICE, INFORMATION PROCESSING SYSTEM, AND METHOD OF CONTROLLING MEMORY MANAGEMENT DEVICE

(71) Applicant: SONY CORPORATION, Tokyo (JP)

(72) Inventor: Takahiro Ikarashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/322,473

(22) PCT Filed: May 22, 2015

(86) PCT No.: PCT/JP2015/064739
§ 371 (c)(1),
(2) Date: Dec. 28, 2016

(87) PCT Pub. No.: WO2016/006332
PCT Pub. Date: Jan. 14, 2016

(65) Prior Publication Data
US 2017/0148502 A1    May 25, 2017

(30) Foreign Application Priority Data
Jul. 9, 2014  (JP) .................................. 2014-141370

(51) Int. Cl.
*G11C 11/40* (2006.01)
*G11C 11/406* (2006.01)
(Continued)

(52) U.S. Cl.
CPC .... *G11C 11/40603* (2013.01); *G06F 13/1636* (2013.01); *G06F 13/1689* (2013.01);
(Continued)

(58) Field of Classification Search
CPC .......... G11C 11/40603; G11C 11/4076; G11C 2207/2254
See application file for complete search history.

(56) References Cited

U.S. PATENT DOCUMENTS 5,911,051 A * 6/1999 Carson .................. G06F 13/161
710/107
6,078,338 A * 6/2000 Horan ........................ G06F 3/14
345/503

(Continued)

FOREIGN PATENT DOCUMENTS

JP      2011-081893 A      4/2011
JP      2011-228782 A     11/2011
(Continued)

*Primary Examiner* — Vanthu T Nguyen
(74) *Attorney, Agent, or Firm* — Chip Law Group

(57) ABSTRACT

The load on an arbiter that conducts arbitration among host devices is reduced in an information processing system that includes the host devices and a storage device. A memory management device includes detecting units and a command generating unit. Each of the detecting units detects a timing to execute a predetermined process for the storage device. The command generating unit generates a command common to the predetermined processes subjected to the detection in the detecting units, and a sideband signal unique to each of the predetermined signals having the execution timings detected.

12 Claims, 10 Drawing Sheets

(51) Int. Cl.
*G11C 11/4076* (2006.01)
*G06F 13/16* (2006.01)
(52) U.S. Cl.
CPC ..... *G11C 11/4076* (2013.01); *G11C 11/40611* (2013.01); *G11C 2207/2254* (2013.01); *G11C 2211/4061* (2013.01)

(56) References Cited

U.S. PATENT DOCUMENTS

| | | | |
|---|---|---|---|
| 6,559,850 B1* | 5/2003 | Strongin | G06F 13/1626 345/520 |
| 7,502,910 B2* | 3/2009 | Damron | G06F 8/4442 712/207 |
| 9,111,632 B2* | 8/2015 | Sato | G06F 13/1636 |
| 9,342,095 B2* | 5/2016 | Oh | G06F 13/1689 |
| 2012/0007630 A1 | 1/2012 | Moon | |
| 2012/0239887 A1 | 9/2012 | Magro et al. | |
| 2015/0085594 A1* | 3/2015 | Dong | G11C 11/40626 365/222 |

FOREIGN PATENT DOCUMENTS

| | | |
|---|---|---|
| JP | 5490239 B2 | 5/2014 |
| WO | 2012/014603 A1 | 2/2012 |

\* cited by examiner

*FIG. 4*

| OPCODE (2 BITS) | ADDRESS (28 BITS) | SIDEBAND SIGNAL | MEANING OF COMMAND |
|---|---|---|---|
| 0 | — | — | Write |
| 1 | — | — | Read |
| 2 | address [2:0] | 0 | NOP |
| | | 1 | AREF (bg0=0) |
| | | 2 | AREF (bg0=1) |
| | | 3 | ZQCS |
| | | 4 | ZQCL |
| | | 5-7 | (Reserved) |
| | address [3] | 0 | NOP |
| | | 1 | PHY Update |
| 3 | — | — | (Reserved) |

MEMORY MANAGEMENT DEVICE, INFORMATION PROCESSING SYSTEM, AND METHOD OF CONTROLLING MEMORY MANAGEMENT DEVICE

CROSS REFERENCE TO RELATED APPLICATIONS

This application is a U.S. National Phase of International Patent Application No. PCT/JP2015/064739 filed on May 22, 2015, which claims priority benefit of Japanese Patent Application No. JP 2014-141370 filed in the Japan Patent Office on Jul. 9, 2014. Each of the above-referenced applications is hereby incorporated herein by reference in its entirety.

TECHNICAL FIELD

The present technology relates to a memory management device, an information processing system, and a method of controlling the memory management device. More particularly, the present technology relates to a memory management device that issues a request for a process, such as refresh, to a storage device including a DRAM, and also relates to an information processing system and a method of controlling the memory management device.

BACKGROUND ART

A dynamic random access memory (DRAM) that is a memory used in a storage device needs refreshing to prevent loss of data stored in memory cells. This refresh should be performed at prescribed intervals. Meanwhile, a synchronous DRAM (SDRAM) that is a kind of DRAM has a ZQ calibration function to increase the waveform quality of a control signal. This is a function to dynamically correct a termination resistor inserted into a signal line for impedance matching even in a case where the impedance of the signal line changes due to a rise in ambient temperature or the like. Like refresh, calibration for performing this correction also needs to be performed at prescribed intervals.

However, these processes require longer periods of time than memory access for a data write/read process. Also, any memory access cannot be made during these processes, and therefore, the load on the arbiter that conducts arbitration of processes for a storage device, including memory access, becomes larger.

To counter this, there is a suggested data processing system that performs control so that refresh and calibration will not occur in succession (see Patent Document 1, for example). This is to perform control so that any command for requesting a process related to refresh or calibration will not be issued for a certain period of time after a command for requesting a process related to the other action between refresh and calibration is issued.

CITATION LIST

Patent Document

Patent Document 1: JP 5490239 B2

SUMMARY OF THE INVENTION

Problems to be Solved by the Invention

The above mentioned conventional art cannot reduce the load on the arbiter when the number of processes for the storage device increases. A host device such as a processor that issues process requests to the storage device requests processes, such as memory access, refresh, and calibration, separately from one another. The arbiter arbitrates these processes, and the host device selected as a result of the arbitration issues a process request to the storage device. Specifically, a command about a requested process is issued to the storage device. However, as the number of process requests increases with an increase in the number of host devices, the number of arbitrations conducted by the arbiter also increases, resulting in an increase in the load on the arbiter. To counter this, a high-performance arbiter is required, which leads to a cost increase.

The present technology has been developed in view of those circumstances, and aims to reduce the load on the arbiter even when the number of process requests to a storage device increases.

Solutions to Problems

The present technology has been developed to solve the above problems, and a first aspect of the present technology is a memory management device that includes: detecting units that detect timings to execute predetermined processes for a storage device; and a command generating unit that generates a command common to the predetermined processes subjected to the detection in the detecting units, and a sideband signal unique to each of the predetermined processes having the execution timings detected. This achieves an effect to detect processes with the detecting units, and generate a command common to these processes and a sideband signal unique to each of the processes.

Also, in this first aspect, the memory management device may further include a select unit that causes the generating unit to generate the command and the sideband signal for the process of the highest priority when the timings detected by the detecting units overlap. This achieves an effect to select the process of the highest priority.

Also, in this first aspect, one of the detecting units may detect the timing at predetermined intervals. This achieves an effect to detect the timing to execute a process at predetermined intervals.

Also, in this first aspect, one of the detecting units may detect a timing to perform refresh on a volatile memory at predetermined refresh intervals in a storage device including the volatile memory. This achieves an effect to detect the timing to perform refresh on the volatile memory at predetermined refresh intervals.

Also, in this first aspect, one of the detecting units may detect a timing to perform calibration on the impedance of a signal line of a volatile memory at predetermined calibration intervals in a storage device including the volatile memory. This achieves an effect to detect the timing to perform calibration on the impedance of a signal line of the volatile memory at predetermined calibration intervals.

Also, in this first aspect, one of the detecting units may detect a timing to perform calibration on the impedance of a signal line of an interface for operating a physical layer at predetermined calibration intervals in a storage device including the interface for operating a physical layer. This achieves an effect to detect the timing to perform calibration on the impedance of a signal line of the interface for operating a physical layer at predetermined calibration intervals.

Also, in this first aspect, one of the detecting units may perform the detection at any appropriate time. This achieves an effect to perform the detection at any appropriate time.

Also, in this first aspect, the command generating unit may supply the generated sideband signal via an address signal line of the storage device. This achieves an effect to supply the sideband signal via an address signal line of the storage device.

Also, a second aspect of the present technology is an information processing system that includes: a storage device; and a memory management device that manages the storage device. The memory management device includes: detecting units that detect timings to execute predetermined processes for the storage device; and a command generating unit that generates a command common to the predetermined processes subjected to the detection in the detecting units, and a sideband signal unique to each of the predetermined processes having the execution timings detected. This achieves an effect to detect processes with the detecting units, and generate a command common to these processes and a sideband signal unique to each of the processes.

Further, a third aspect of the present technology is a method of controlling a memory management device. This method includes: steps of detecting timings to execute predetermined processes for a storage device; and a command generation step of generating a command common to the predetermined processes subjected to the detection in the detection steps, and a sideband signal unique to each of the predetermined processes having the execution timings detected. This achieves an effect to detect processes with the detecting units, and generate a command common to these processes and a sideband signal unique to each of the processes.

Effects of the Invention

According to the present technology, an excellent effect to reduce the load on an arbiter can be achieved even in a case where the number of process requests to a storage device increases. It should be noted that effects of the present technology are not limited to the effects described above, and may include any of the effects described in the present disclosure.

BRIEF DESCRIPTION OF DRAWINGS

FIG. 4 is a table showing an example configuration of commands according to the first embodiment of the present technology.

MODES FOR CARRYING OUT THE INVENTION

The following is a description of modes for carrying out the present technology (the modes will be hereinafter referred to as the embodiments). Explanation will be made in the following order.

1. First embodiment (an example where a single process is performed on a storage device)
2. Second embodiment (an example where processes are simultaneously performed on a storage device)
3. Modification 1. First Embodiment

[Configuration of an Information Processing System]

Figure 1:
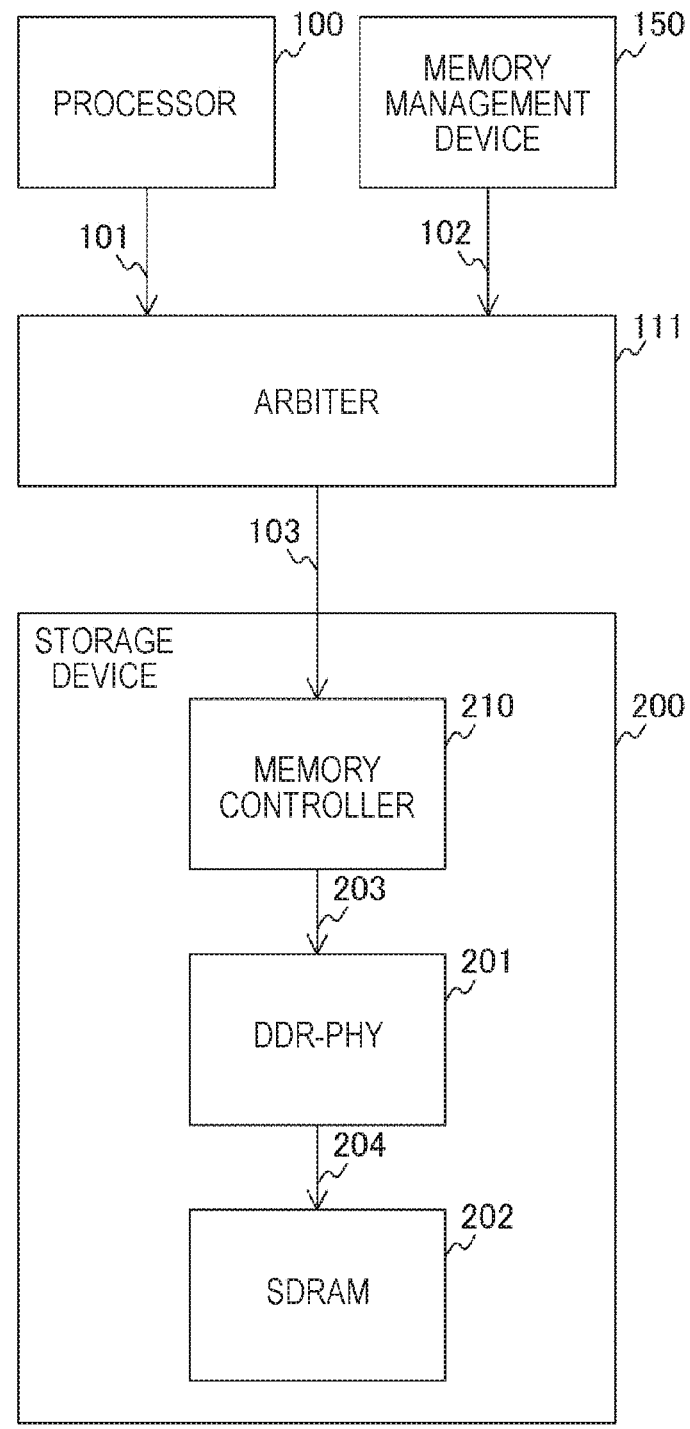
FIG. 1 is a diagram showing an example configuration of an information processing system according to an embodiment of the present technology.

FIG. 1 is a diagram showing an example configuration of an information processing system according to an embodiment of the present technology. The information processing system according to an embodiment of the present technology includes a processor 100, a memory management device 150, an arbiter 111, and a storage device 200. The processor 100 issues a data write or read command to the storage device 200, and exchanges data with the storage device 200. This processor 100 issues a command via a signal line 101. This command is formed with an opcode for identifying the type of the command, and address information that is an operand. The signal line 101 is also divided into an opcode signal line for transmitting opcodes and an address signal line for transmitting address information.

The memory management device 150 manages processes other than data writes and reads for the storage device 200. These processes include refresh of a memory element, for example. The process will be described later in detail. This memory management device 150 manages the timings to perform the respective processes, and issues a command corresponding to a process having its execution timing detected. If the timings to execute processes are simultaneously detected, arbitration is conducted inside the memory management device 150. After that, a command corresponding to the process selected through the arbitration is issued. It should be noted that the memory management device 150 issues a command via a signal line 102. Like a command issued by the processor 100, this command is also formed with an opcode and an operand. However, a sideband signal, instead of address information, is output as this operand. This command will also be described later in detail.

The arbiter 111 arbitrates process requests issued to the storage device 200 from the processor 100 and the memory management device 150. Before the processor 100 and the memory management device 150 issue commands to the storage device 200, arbitration needs to be conducted by the arbiter 111. As a result of the arbitration, only the processor 100 or the memory management device 150, whichever is granted a right to use the storage device 200, can issue a command to the storage device 200. The arbiter 111 transfers the command to the storage device 200 via a signal line 103. In doing so, the arbiter 111 outputs an acknowledgement signal as a response signal to the processor 100 or the memory management device 150, whichever is the command source, and notifies the processor 100 or the memory management device 150 of the end of the process in the arbiter 111.

The storage device 200 is designed to store data. This storage device 200 includes a memory controller 210, a double data rate-physical interface (DDR-PHY) 201, and an SDRAM 202. The memory controller 210 controls the entire storage device 200. This memory controller 210 also interprets a command transferred by the arbiter 111, and issues requests to the DDR-PHY 201 and the SDRAM 202. These requests are issued via a signal line 203.

The DDR-PHY 201 is an interface for operating an physical layer. This DDR-PHY 201 performs serial-parallel conversion on data in exchanging signals between the memory controller 210 and the SDRAM 202, and adjusts timings, for example. It should be noted that, of the requests issued by the memory controller 210, a request to the SDRAM 202 is transferred via a signal line 204. The SDRAM 202 is a volatile memory that stores data. The SDRAM 202 according to an embodiment of the present technology may be a DDR-SDRAM that is an SDRAM of a double data rate (DDR) type. This DDR-SDRAM is an SDRAM that enables high-speed data transfer by transferring data at both times of a rise and a fall of a clock signal.

It should be noted that the data signal line for transmitting data, the control signal line for transmitting control signals, and the like are not shown in FIG. 1. Command and request exchanges in the information processing system shown in FIG. 1 will be described below through an example case where the processor 100 writes data. First, the processor 100 issues a request for use of the storage device 200 to the arbiter 111. After a permit to use the storage device 200 is issued from the arbiter 111, the processor 100 issues a write command, and outputs the data related to this command. The command and the data are transferred to the memory controller 210 of the storage device 200 via the arbiter 111. The memory controller 210 interprets this command, and generates and issues a write request to the SDRAM 202. This request and the data related to the write are transferred to the SDRAM 202 via the DDR-PHY 201, and a write is performed in the SDRAM 202.

[Process in the Memory Management Device 150]

The process to be performed by the memory management device 150 to manage the storage device 200 is now described. A first example of this process is refresh of the SDRAM 202. In the first embodiment of the present technology, an auto-refresh function of the SDRAM 202 can be used in this refresh. This is to send an auto-refresh command to the SDRAM 202, to cause a counter in the SDRAM 202 to automatically generate a refresh address, and have refresh performed in accordance with the refresh address. To prevent loss of data stored in the SDRAM 202, this refresh needs to be performed at predetermined intervals.

Meanwhile, a second example of this process is calibration of the impedance of the signal line of the SDRAM 202. A drive unit for the signal line that connects a DQ signal as a signal of the SDRAM 202 has a function to correct a termination resistor in accordance with changes in the impedance of the DQ signal line. Calibration is a process of maintaining the quality of DQ signal transmission by conducting impedance matching using this correction function. This calibration may be zero quotient calibration short (ZQCS) to be performed at predetermined intervals to cope with changes in the impedance due to rises in ambient temperature. Other than that, there is zero quotient calibration long (ZQCL) to be performed at any appropriate time, such as a time when the SDRAM 202 is activated or returns from a power saving mode.

Further, a third example of this process is update of the internal settings of the DDR-PHY 201. Through this update (hereinafter referred to as the PHY update), the DDR-PHY 201 performs calibration on the signal line impedance being driven. Like the ZQCS calibration, the PHY update needs to be performed at predetermined intervals.

[Configuration of the Memory Management Device]

Figure 2:
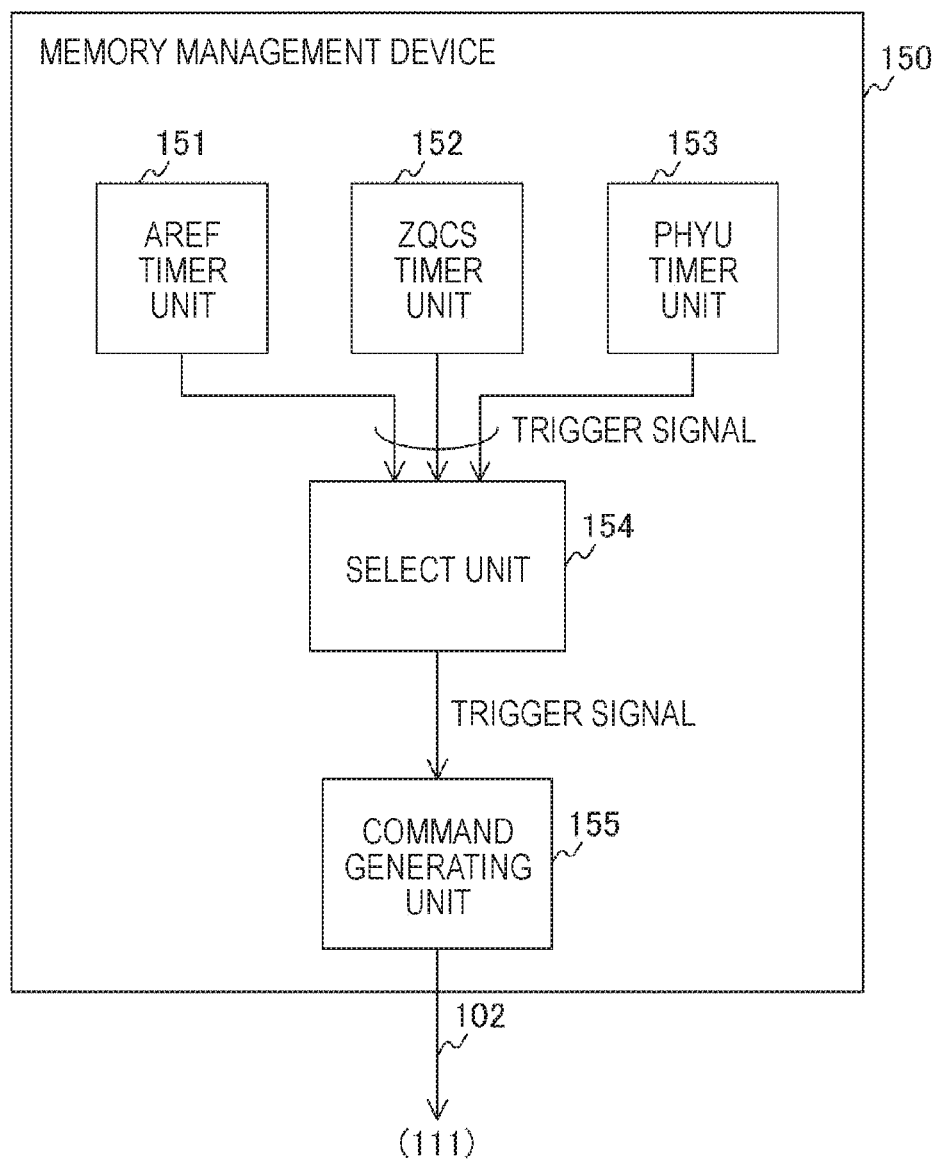
FIG. 2 is a diagram showing an example configuration of a memory management device according to a first embodiment of the present technology.

FIG. 2 is a diagram showing an example configuration of a memory management device according to a first embodiment of the present technology. The memory management device 150 includes an AREF timer unit 151, a ZQCS timer unit 152, a PHYU timer unit 153, a select unit 154, and a command generating unit 155.

The AREF timer unit 151 detects a timing to perform auto-refresh on the SDRAM 202 at predetermined refresh intervals. This AREF timer unit 151 has a timer function. This is a function to start measuring time, and output a trigger signal every time a predetermined time passes. With this timer function, the AREF timer unit 151 detects a timing to perform auto-refresh on the SDRAM 202. Therefore, the time corresponding to each refresh interval in the SDRAM 202 is set in the AREF timer unit 151.

The ZQCS timer unit 152 detects a timing to perform ZQCS calibration on the SDRAM 202 at predetermined calibration intervals. Like the AREF timer unit 151, this ZQCS timer unit 152 includes a timer function, and detects a timing to perform ZQCS calibration on the SDRAM 202. Therefore, the time corresponding to each interval at which ZQCS calibration is performed on the SDRAM 202 is set in the ZQCS timer unit 152.

The PHYU timer unit 153 detects a timing to perform PHY update on the DDR-PHY 201 at predetermined update intervals. Like the AREF timer unit 151, this PHYU timer unit 153 includes a timer function, and detects a timing to perform PHY update on the DDR-PHY 201. Therefore, the time corresponding to each interval at which PHY update is performed on the DDR-PHY 201 is set in the PHYU timer unit 153.

The select unit 154 selects a trigger signal that is output from the AREF timer unit 151, the ZQCS timer unit 152, or the PHYU timer unit 153. In a case where trigger signals are simultaneously output as a result of overlapping of process execution timings detected by the AREF timer unit 151, the ZQCS timer unit 152, and the PHYU timer unit 153, this select unit 154 selects and outputs one of the trigger signals. In doing so, the select unit 154 selects the trigger signal corresponding to the process of the highest priority.

This select operation is now described through an example case where trigger signals output from the AREF timer unit 151 and the ZQCS timer unit 152 overlap. The AREF timer unit 151 and the ZQCS timer unit 152 measure the timings to perform auto-refresh and ZQCS calibration, respectively. In a case where an SDRAM of a double data rate 3 (DDR3) type is used, the time intervals at which these processes are performed are 7.8 μs and 128 ms, respectively. The ZQCS calibration time intervals are longer, and auto-refresh may be skipped within prescribed limits. Therefore, the select unit 154 determines that the priority of ZQCS calibration is higher than the priority of auto-refresh. The select unit 154 then selects and outputs the trigger signal output from the ZQCS timer unit 152.

To additionally describe this operation, refresh is to be performed at least 8192 times in 64 ms in an SDRAM of DDR3 type. The mean refresh execution interval tREFI is calculated to be 7.8125 µs, according to $$64 \text{ m}/8192=7.8125\mu.$$

To allow a margin, auto-refresh is performed every 7.8 µs, which is shorter than the above. When the timing overlaps with the timing to perform another process, this auto-refresh is skipped, and the other process or ZQCS calibration in this case is performed. Since ZQCS calibration is performed every 128 ms, the number of auto-refresh processes to be skipped is small, and the above mentioned refresh limits can be met. Taking these aspects into account, the select unit 154 performs a select operation based on the above determination. It should be noted that the time intervals at which a PHY update process is performed may be 64 ms, like the time intervals for ZQCS calibration. Accordingly, when trigger signals output from the AREF timer unit 151 and the PHYU timer unit 153 overlap, the select unit 154 can select the trigger signal output from the PHYU timer unit 153.

The command generating unit 155 generates a command based on the trigger signal selected by the select unit 154. This command is formed with an opcode and an operand. This opcode is an opcode common to the processes being managed by the memory management device 150. In the first embodiment of the present technology, a common opcode is generated for the three processes: auto-refresh, ZQCS calibration, and PHY update. The command generating unit 155 also generates a sideband signal equivalent to the operand. This sideband signal is a signal unique to a process being managed by the memory management device 150. In the first embodiment of the present technology, sideband signals unique to auto-refresh, ZQCS calibration, and PHY update, respectively, are generated by the command generating unit 155. From this sideband signal, the storage device 200 identifies the process indicated by a command issued from the memory management device 150.

It should be noted that this sideband signal is output to the address signal line of the signal line 102 in the first embodiment of the present technology. Unlike the processor 100, the memory management device 150 does not perform data transfer and the like designating addresses. Instead, sideband signals are transmitted to the storage device 200 through this address signal line. It should be noted that the AREF timer unit 151, the ZQCS timer unit 152, and the PHYU timer unit 153 are an example of the detecting unit in the claims.

[Configuration of the Memory Controller]

Figure 3:
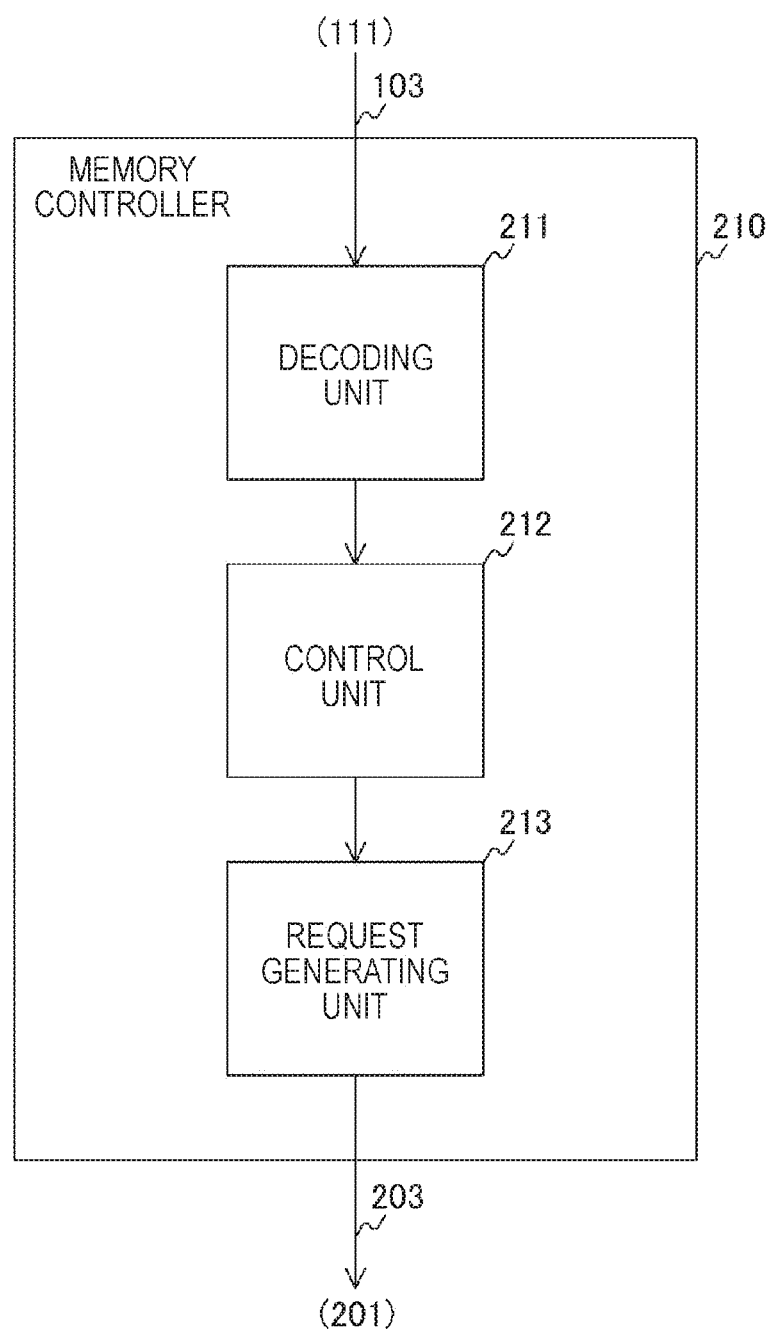
FIG. 3 is a diagram showing an example configuration of a memory controller according to the first embodiment of the present technology.

FIG. 3 is a diagram showing an example configuration of the memory controller according to the first embodiment of the present technology. The memory controller 210 includes a decoding unit 211, a control unit 212, and a request generating unit 213. The decoding unit 211 decodes a command transferred from the arbiter 111. This decoding unit 211 performs the decoding in accordance with the opcode and the sideband signal in the command. The control unit 212 controls the entire memory controller 210, and interprets the command decoded by the decoding unit 211. The request generating unit 213 generates requests to the DDR-PHY 201 and the SDRAM 202. This request generating unit 213 generates requests in accordance with the command interpreted by the control unit 212. In addition to these components, the memory controller 210 includes an address converting unit that converts a logical address designated by the processor 100 into a physical address in the SDRAM 202, and others. However, these components are not described herein.

[Configuration of Commands]

FIG. 4 is a table showing an example configuration of commands according to the first embodiment of the present technology. Each command in the table has a bit width of 30 bits, and is formed with a 2-bit opcode field and an address field that is a 28-bit operand. The commands with opcodes "0" and "1" are the commands to be used primarily by the processor 100, and are a write command and a read command, respectively. The addresses designate the data write address and the data read address. Meanwhile, the commands with an opcode "2" are the commands to be used by the memory management device 150. This is because a common opcode is allotted to the processes to be performed by the memory management device 150 to manage the storage device 200. In FIG. 4, five kinds of processes, excluding NOP, are shown. To identify each of these processes, a sideband signal is generated and is output to the lower four bits (address [3:0]) in the address signal. It should be noted that AREF (bg0=0) in FIG. 4 means a case where a control signal input bg0 is logical "0" in an auto-refresh process. Likewise, AREF (bg0=1) in FIG. 4 means a case where the control signal input bg0 is logical "1" in an auto-refresh process. These cases will be described below.

In the auto-refresh in FIG. 4, dynamic changes of refresh parameters to those in a different refresh mode are accommodated, with the use of an SDRAM of a double data rate 4 (DDR4) type being taken into account. In this case, a refresh mode change can be made with a signal input from outside. When the control signal input bg0 is switched to logical "0", the SDRAM enters a 1× refresh rate mode. Where tREFI in this mode is expressed as tREFI(base), tREFI(base) is defined as 7.8 µs, and tRFC indicating the refresh time is defined as 160 ns. When the control signal input bg0 is switched to logical "1", the SDRAM enters a 2× refresh rate mode or a 4× refresh rate mode. In the 2× refresh rate mode, tREFI is defined as tREFI (base)/2, and tRFC is defined as 110 ns. Meanwhile, in the 4× refresh rate mode, tREFI is defined as tREFI(base)/4, and tRFC is defined as 90 ns. It should be noted that, in accordance with a value that is set by a register for setting a mode of the SDRAM 202, the mode in a case where the control signal input bg0 is logical "1" can be changed to the 2× refresh rate mode or the 4× refresh rate mode.

The refresh in a case where this control signal input bg0 is switched to logical "0" (AREF(bg0=0)) is equivalent to the auto-refresh process described above with reference to FIG. 2. The principal processes that are auto-refresh (AREF (bg0=0)), ZQCS calibration, and PHY update among the processes shown in FIG. 4 for memory management are accommodated in the case illustrated in FIG. 2.

Figure 5:
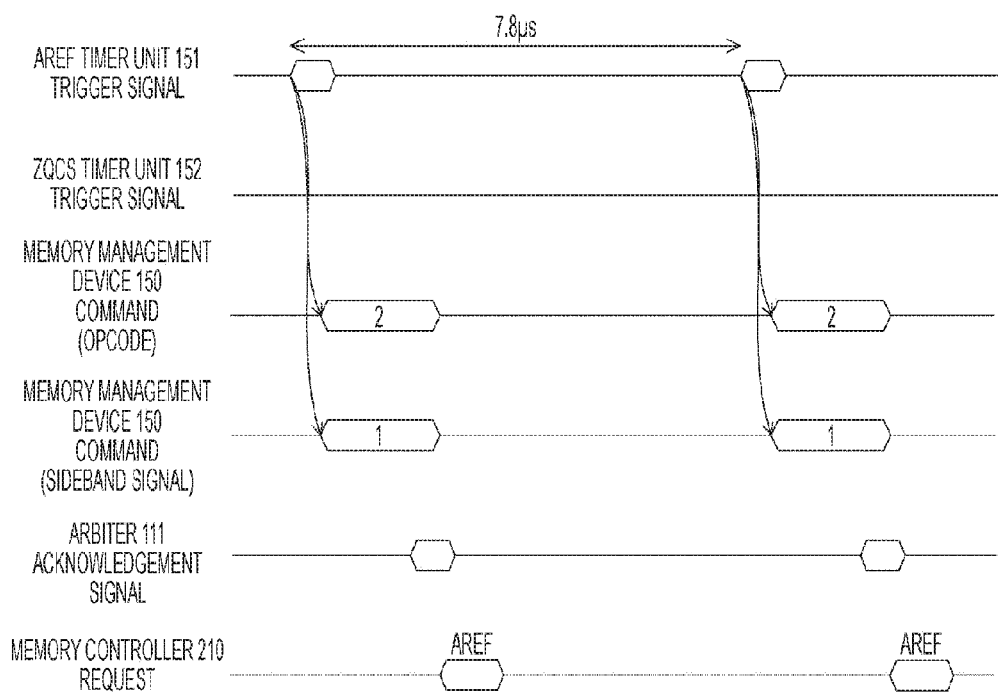
FIG. 5 is a chart showing processes to be performed by the memory management device 150 according to the first embodiment of the present technology.
Figure 6:
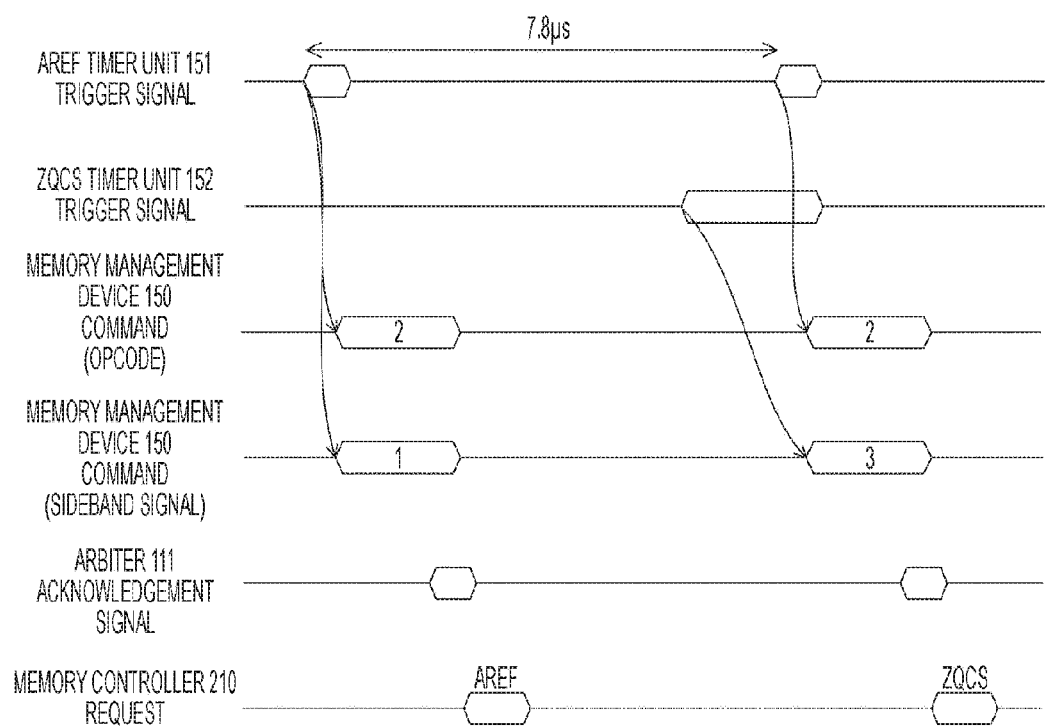
FIG. 6 is a chart showing processes to be performed by the memory management device 150 according to the first embodiment of the present technology.

Referring now to FIGS. 5 and 6, processes in the memory management device 150 are described through examples where an auto-refresh process and ZQCS calibration are performed.

FIG. 5 is a chart showing processes to be performed by the memory management device 150 according to the first embodiment of the present technology. This chart shows the relationship among a trigger signal from the AREF timer unit 151, a trigger signal from the ZQCS timer unit 152, a command from the memory management device 150, an acknowledgement signal from the arbiter 111, and a request from the memory controller 210. In this chart, the trigger signal from the AREF timer unit 151 is output at intervals of 7.8 µs. During this period, the ZQCS timer unit 152 does not output the trigger signal. Therefore, the trigger signal from the AREF timer unit 151 is selected by the select unit 154, and an auto-refresh command is generated by the command generating unit 155. At this point of time, the opcode of the command is "2", and the sideband signal is "1", which corresponds to auto-refresh. The generated command is issued to the arbiter 111. After that, the arbiter 111 outputs the acknowledgement signal to the memory management device 150. Receiving this acknowledgement signal, the memory management device 150 suspends the command issuance. The arbiter 111 transfers the command to the memory controller 210. The memory controller 210 interprets this command, and issues an auto-refresh request.

FIG. 6 is a chart showing processes to be performed by the memory management device 150 according to the first embodiment of the present technology. This chart differs from FIG. 5 in that the ZQCS timer unit 152 outputs the trigger signal. In FIG. 6, the trigger signal from the ZQCS timer unit 152 is output immediately before the trigger signal from the AREF timer unit 151 is output for the second time. At this point of time, the select unit 154 selects the trigger signal output from the ZQCS timer unit 152 of the higher priority. In accordance with this selection, a command is generated by the command generating unit 155. At this point of time, the opcode of the command is "2", but the sideband signal is "3", which corresponds to ZQCS. The generated command is transferred to the memory controller 210 via the arbiter 111. The memory controller 210 interprets this command, and issues a ZQCS calibration request.

Figure 7:
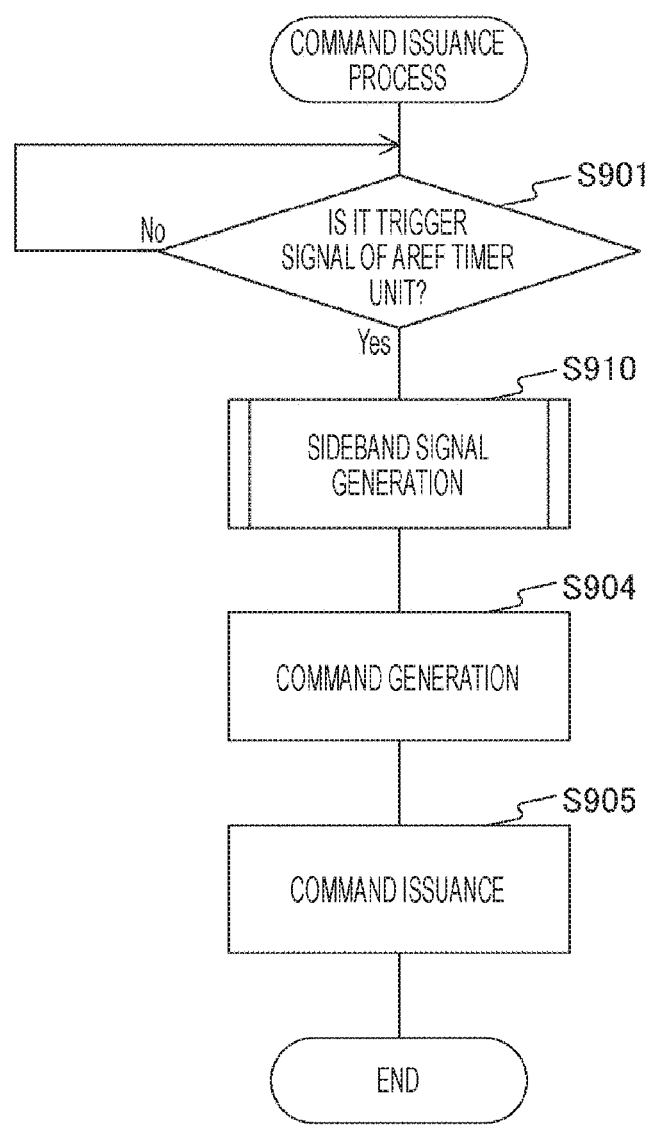
FIG. 7 is a chart showing an example of the processing procedures in a command issuance process according to the first embodiment of the present technology.

FIG. 7 is a chart showing an example of the processing procedures in a command issuance process according to the first embodiment of the present technology. The memory management device 150 awaits an output of the trigger signal from the AREF timer unit 151 (step S901). As a result, when the trigger signal is output from the AREF timer unit 151 (Yes in step S901), a sideband signal generation process is performed (step S910). The command generating unit 155 then generates a command (step S904). This is performed by adding "2" as the opcode to the sideband signal generated in step S910. Lastly, the generated command is issued (step S905), and the command issuance process comes to an end. As described above, in the command issuance process, a timing to perform a memory management process is detected in accordance with the trigger signal from the AREF timer unit 151, and a command is generated.

Figure 8:
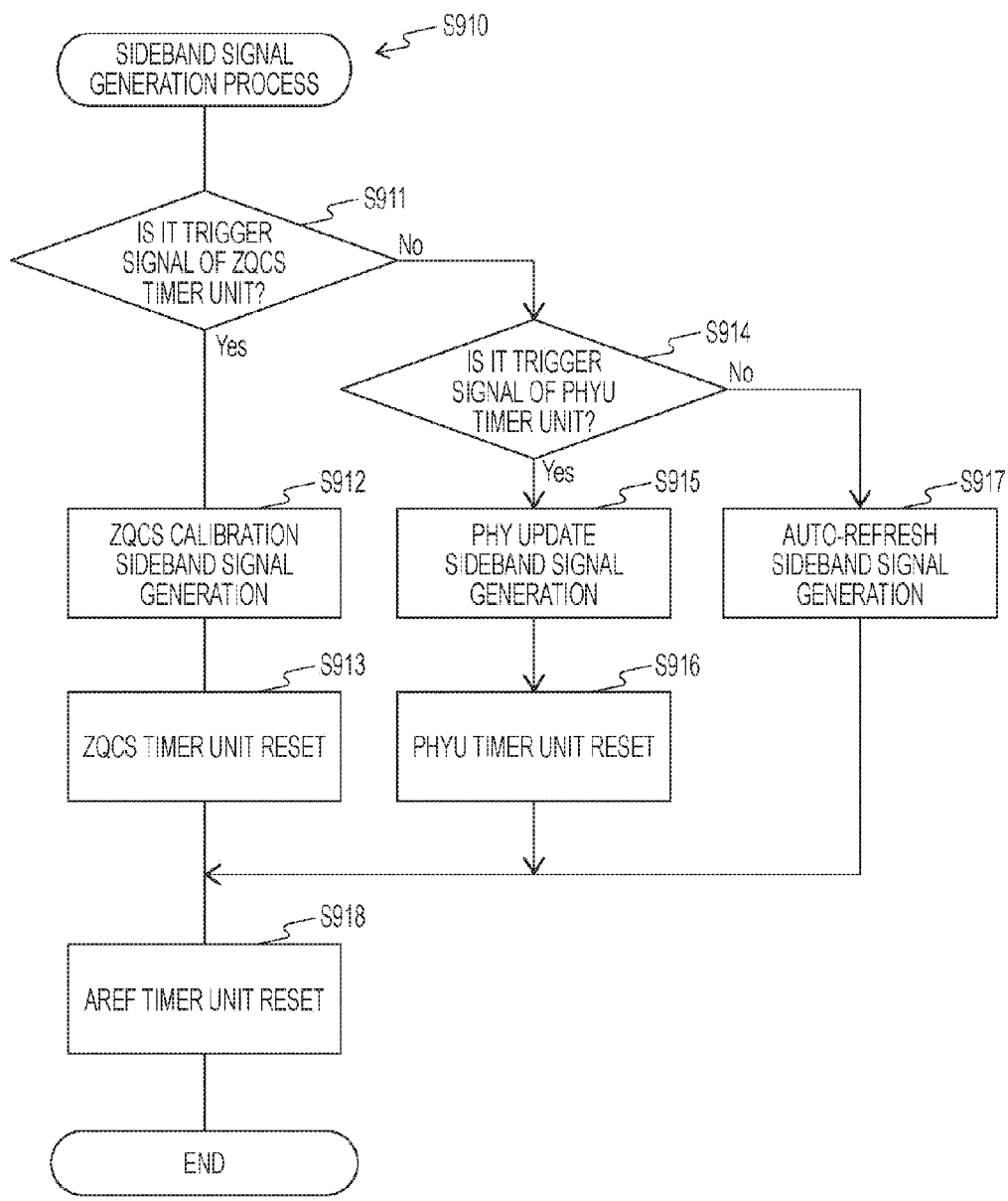
FIG. 8 is a chart showing an example of the processing procedures in a sideband signal generation process according to the first embodiment of the present technology.

FIG. 8 is a chart showing an example of the processing procedures in a sideband signal generation process according to the first embodiment of the present technology. The select unit 154 checks whether the trigger signal is being output from the ZQCS timer unit 152 (step S911). If the result shows that the trigger signal is output from the ZQCS timer (Yes in step S911), the select unit 154 selects the trigger signal from the ZQCS timer unit 152 of the higher priority. Receiving this trigger signal, the command generating unit 155 generates a sideband signal for ZQCS calibration (step S912). The ZQCS timer unit 152 is then reset (step S913). After that, the process moves on to the procedure in step S918.

If the trigger signal is not being output from the ZQCS timer (No in step S911), on the other hand, the select unit 154 checks whether the trigger signal is being output from the PHYU timer unit 153 (step S914). If the result shows that the trigger signal is output from the PHYU timer (Yes in step S914), the select unit 154 selects the trigger signal from the PHYU timer unit 153 of the higher priority. Receiving this trigger signal, the command generating unit 155 generates a sideband signal for PHY update (step S915). The PHYU timer unit 153 is then reset (step S916). After that, the process moves on to the procedure in step S918.

If the trigger signal is not being output from the PHYU timer (No in step S914), on the other hand, the select unit 154 selects the trigger signal from the AREF timer unit 151. Receiving this trigger signal, the command generating unit 155 generates a sideband signal for auto-refresh (step S917). After that, the process moves on to the procedure in step S918. In the procedure in step S918, the AREF timer unit 151 is reset (step S918), and the sideband signal generation process comes to an end.

As described above, in the first embodiment of the present technology, the memory management device 150 detects the timings to perform processes for managing the storage device 200 and selects one of the timings, and a command indicating the detection and the selection is output to the arbiter 111. With this, the arbiter 111 does not need to conduct arbitration for each of the above described processes. Even if the number of processes related to the storage device 200 increases, the load on the arbiter 111 can be reduced. Also, as for the examples of the refresh and the calibration described in the first embodiment of the present technology, the mean execution intervals and the like are defined in the respective specifications, and it is difficult for the arbiter 111 to conduct arbitration in such a manner as to meet the specifications for all the processes. In the first embodiment of the present technology, on the other hand, the memory management device 150 can conduct arbitration to meet the respective specifications in those processes.

2. Second Embodiment

In the first embodiment of the present technology, the memory management device 150 generates a command so that one process is performed in accordance with one command. In a second embodiment of the present technology, on the other hand, a command corresponding to processes that can be simultaneously performed is generated.

In the second embodiment of the present technology, auto-refresh and PHY update are simultaneously performed. These processes are the processes to be performed in the SDRAM 202 and the DDR-PHY 201, respectively, and can be simultaneously performed. In a memory management device 150 according to the second embodiment of the present technology, when trigger signals from the AREF timer unit 151 and the PHYU timer unit 153 are output in an overlapping manner, the select unit 154 outputs these two trigger signals to the command generating unit 155. In accordance with these trigger signals, the command generating unit 155 generates a sideband signal for auto-refresh and PHY update. Also, in accordance with this sideband signal, the memory controller 210 issues a request for auto-refresh, and outputs a control signal for performing PHY update. Except for the above, the configuration of the information processing system according to the second embodiment of the present technology may be similar to the configuration according to the first embodiment of the present technology. Therefore, explanation of the configuration is not made herein.

Figure 9:
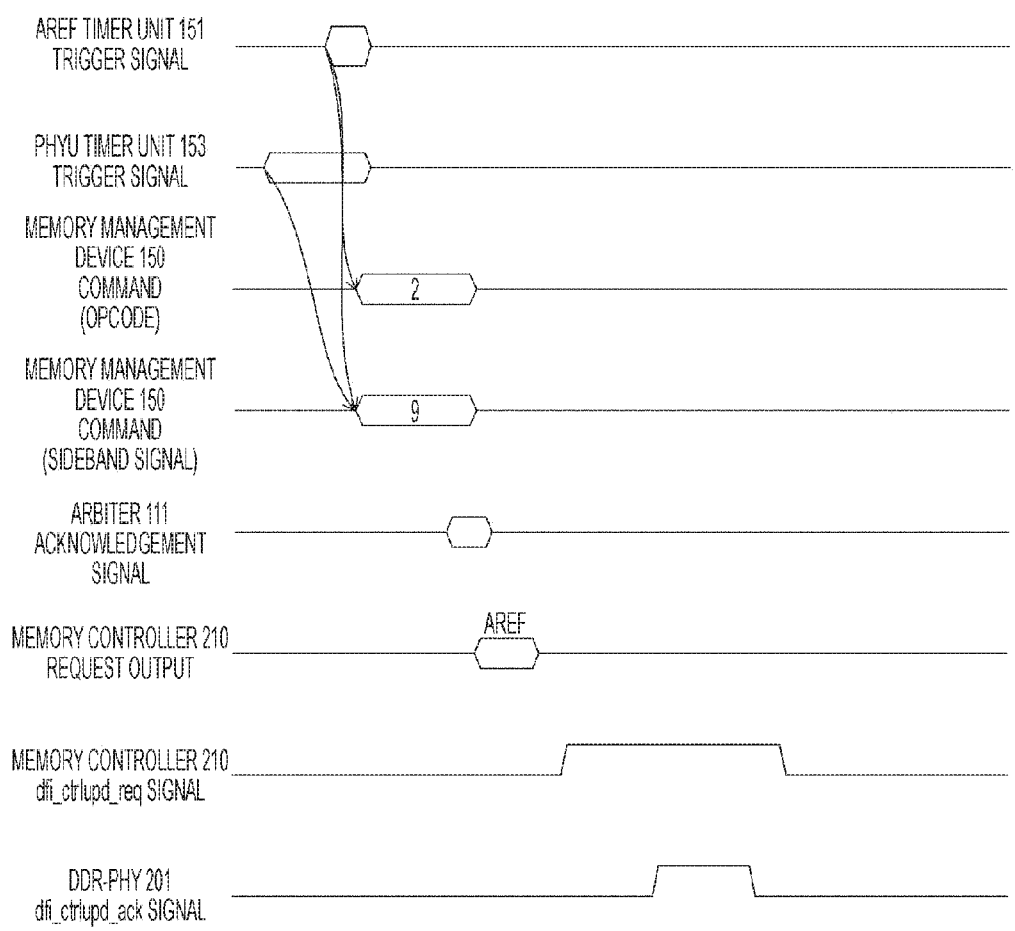
FIG. 9 is a chart showing processes to be performed by a memory management device 150 according to a second embodiment of the present technology.

FIG. 9 is a chart showing processes to be performed by the memory management device 150 according to the second embodiment of the present technology. This chart differs from FIG. 5 in that the PHYU timer, instead of the ZQCS timer unit 152, outputs a trigger signal, and a control signal from the memory controller 210 and a control signal from the DDR-PHY 201 are also shown. In FIG. 9, the trigger signal from the PHYU timer unit 153 is output immediately before the trigger signal from the AREF timer unit 151 is output. As auto-refresh and PHY update can be simultaneously performed, the select unit 154 outputs both trigger signals to the command generating unit 155. In accordance with this output, a command is generated by the command generating unit 155. At this point of time, the opcode of the command is "2", but the sideband signal is "9", which corresponds to both auto-refresh and PHY update. As described above with reference to FIG. 4, the respective signal bits indicating auto-refresh and PHY update are allotted to different bits in the sideband signal, so that the sideband signal simultaneously indicating both processes can be generated.

The generated command is transferred to the memory controller 210 via the arbiter 111. The memory controller 210 interprets this command, and issues an auto-refresh request. The memory controller 210 further outputs a PHY update request signal to the DDR-PHY 201. This is performed by switching a signal line dri_ctrlupd_req to H level. In a case where PHY update is possible, the DDR-PHY 201 outputs a response signal to the memory controller 210. This is performed by switching dfi_ctrlupd_ack to H level. It should be noted that although auto-refresh and PHY update are simultaneously performed in the above described example, the combination is not limited to that, and any other combination of processes may be simultaneously performed in the second embodiment of the present technology. For example, ZQCS calibration and PHY update may be simultaneously performed.

In this manner, the memory management device 150 according to the second embodiment of the present technology can generate a command for simultaneously execution of auto-refresh and PHY update. Thus, these processes can be simultaneously performed on the storage device 200, and the processing time can be made shorter than that in a case where these processes are performed independently of each other.

3. Modifications

In the first embodiment of the present technology, a timing to perform a process for managing the storage device 200 is detected at predetermined intervals. In a modification of an embodiment of the present technology, on the other hand, the detection is performed at any appropriate time. Accordingly, even in a case where a process for managing the storage device 200 is performed at any appropriate time, the memory management device 150 detects timings to perform processes for managing the storage device 200, and selects one of the timings. That is, the load on the arbiter 111 can be reduced.

Figure 10:
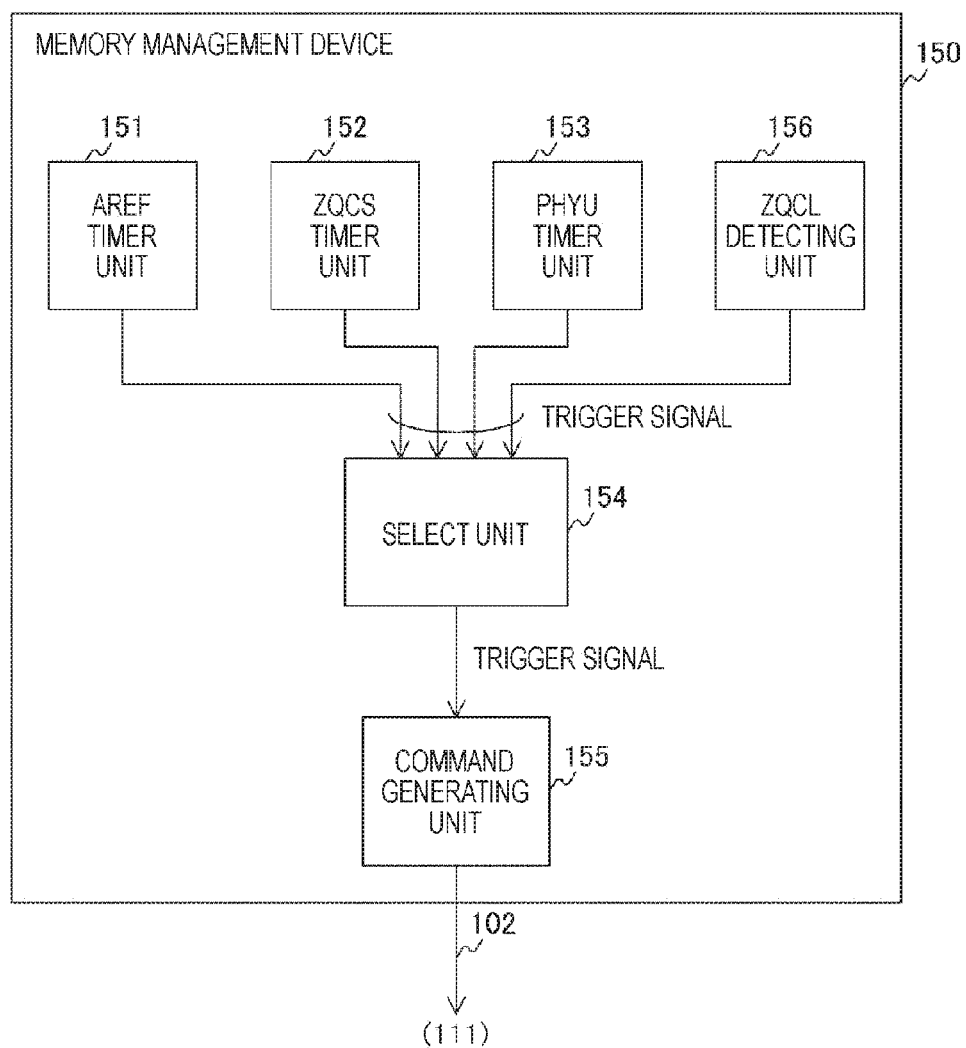
FIG. 10 is a diagram showing an example configuration of a memory management device according to a modification of an embodiment of the present technology.

FIG. 10 is a diagram showing an example configuration of a memory management device according to the modification of an embodiment of the present technology. The memory management device 150 shown in this diagram differs from the memory management device 150 described above with reference to FIG. 2 in that a ZQCL detecting unit 156 is also included, and the select unit 154 selects a trigger signal from among four trigger signals. The ZQCL detecting unit 156 detects a timing to perform ZQCL calibration. As described above, ZQCL calibration is performed at any appropriate time, such as a time when the SDRAM 202 is activated or returns from a power saving mode. Therefore, after the SDRAM 202 is activated and returns from a power saving mode, the ZQCL detecting unit 156 generates a trigger signal and outputs the trigger signal to the select unit 154. Except for the above, the configurations of the memory management device 150 and the information processing system may be similar to the configurations according to the first embodiment of the present technology. Therefore, explanation of the configurations is not made herein.

As described so far, according to an embodiment of the present technology, the memory management device 150 detects the timings to perform processes for managing the storage device 200 and selects one of the timings. Because of this, arbitration of requests for the above described processes can be conducted in advance. Thus, the load on the arbiter 111 can be reduced even in a case where the number of processes related to the storage device 200 increases.

It should be noted that the above described embodiments are examples for embodying the present technology, and the matter of the embodiments corresponds to the subject matter of the claims. Likewise, the subject matter of the claims corresponds to the matter under the same names as the subject matter of the claims in the embodiments of the present technology. However, the present technology is not limited to the embodiments, and various changes can be made to the embodiments without departing from the scope of the technology.

Also, the processing procedures described above in the embodiments may be regarded as a method involving the series of these procedures, or may be regarded as a program for causing a computer to carry out the series of these procedures or as a recording medium storing the program. This recording medium may be a compact disc (CD), a minidisc (MD), a digital versatile disc (DVD), a memory card, or a Blu-ray (a registered trade name) disc, for example.

It should be noted that the advantageous effects described in this specification are merely examples, and the advantageous effects of the present technology may include other effects.

It should be noted that the present technology may also be embodied in the configurations described below.

(1) A memory management device including:
detecting units that detect timings to execute predetermined processes for a storage device; and
a command generating unit that generates a command common to the predetermined processes subjected to the detection in the detecting units, and a sideband signal unique to each of the predetermined processes having the execution timings detected.

(2) The memory management device of (1) further including
a select unit that causes the generating unit to generate the command and the sideband signal for the process of the highest priority when the timings detected by the detecting units overlap.

(3) The memory management device of (1) or (2), wherein one of the detecting units detects the timing at predetermined intervals.

(4) The memory management device of (3), wherein one of the detecting units detects a timing to perform refresh on a volatile memory at predetermined refresh intervals in a storage device including the volatile memory.

(5) The memory management device of (3), wherein one of the detecting units detects a timing to perform calibration on the impedance of a signal line of a volatile memory at predetermined calibration intervals in a storage device including the volatile memory.

(6) The memory management device of (3), wherein one of the detecting units detects a timing to perform calibration on the impedance of a signal line of an interface for operating a physical layer at predetermined calibration intervals in a storage device including the interface for operating the physical layer.

(7) The memory management device of (1) or (2), wherein one of the detecting units performs the detection at an appropriate time.

(8) The memory management device of any of (1) through (7), wherein the command generating unit supplies the generated sideband signal via an address signal line of the storage device.

(9) An information processing system including:
a storage device; and
a memory management device that manages the storage device,
the memory management device including:
detecting units that detect timings to execute predetermined processes for the storage device; and
a command generating unit that generates a command common to the predetermined processes subjected to the detection in the detecting units, and a sideband signal unique to each of the predetermined processes having the execution timings detected.

(10) A method of controlling a memory management device,
the method including:
detection steps of detecting timings to execute predetermined processes for a storage device; and
a command generation step of generating a command common to the predetermined processes subjected to the detection in the detection steps, and a sideband signal unique to each of the predetermined processes having the execution timings detected.

REFERENCE SIGNS LIST

100 Processor
101 to 103, 203, 204 Signal line
111 Arbiter
150 Memory management device
151 AREF timer unit
152 ZQCS timer unit
153 PHYU timer unit
154 Select unit
155 Command generating unit
156 ZQCL detecting unit
200 Storage device
201 DDR-PHY
202 SDRAM
210 Memory controller
211 Decoding unit
212 Control unit
213 Request generating unit

The invention claimed is:

1. A memory management device, comprising:
a plurality of detecting units configured to detect a plurality of timings to execute a plurality of processes for a storage device; and
a command generating unit configured to:
generate a command, wherein the command comprises an opcode that identifies a type of command, and wherein a value of the opcode is identical to the plurality of processes; and
generate a plurality of sideband signals, wherein one sideband signal of the plurality of sideband signals is generated for each of the plurality of processes,
wherein the plurality of sideband signals includes a first sideband signal for a first process of the plurality of processes and a second sideband signal for a second process of the plurality of processes, and
wherein the first sideband signal is different from the second sideband signal.

2. The memory management device according to claim 1, further comprising
a select unit configured to control the generation of the command and the plurality of sideband signals for the first process based on an overlap between the detected plurality of timings,
wherein the first process has a highest priority among the plurality of processes.

3. The memory management device according to claim 1, wherein a first detecting unit of the plurality of detecting units is configured to detect a first timing of the plurality of timings at an interval.

4. The memory management device according to claim 3, wherein the first detecting unit of the plurality of detecting units is further configured to detect the first timing to refresh a volatile memory at a refresh interval, and wherein the storage device includes the volatile memory.

5. The memory management device according to claim 3, wherein a second detecting unit of the plurality of detecting units is configured to detect a second timing of the plurality of timings to calibrate impedance of a signal line of a volatile memory at a calibration interval, and wherein the storage device includes the volatile memory.

6. The memory management device according to claim 3, wherein a second detecting unit of the plurality of detecting units is configured to detect a second timing of the plurality of timings to calibrate impedance of a signal line of an interface, wherein the interface is calibrated to operate a physical layer at a calibration interval, and wherein the storage device includes the interface to operate the physical layer.

7. The memory management device according to claim 1, wherein one of the plurality of detecting units is configured to detect the plurality of timings at a particular time.

8. The memory management device according to claim 1, wherein the command generating unit is further configured to supply the plurality of sideband signals via an address signal line of the storage device.

9. An information processing system, comprising:
a storage device; and
a memory management device configured to manage the storage device,
wherein the memory management device includes:
a plurality of detecting units configured to detect a plurality of timings to execute a plurality of processes for the storage device; and
a command generating unit configured to:
generate a command, wherein the command comprises an opcode that identifies a type of command, and wherein a value of the opcode is identical to the plurality of processes; and
generate a plurality of sideband signals, wherein one sideband signal of the plurality of sideband signals is generated for each of the plurality of processes,
wherein the plurality of sideband signals includes a first sideband signal for a first process of the plurality of processes and a second sideband signal for a second process of the plurality of processes, and
wherein the first sideband signal is different from the second sideband signal.

10. A method of controlling a memory management device, the method comprising:
detecting a plurality of timings to execute a plurality of processes for a storage device; and generating a command, wherein the command comprises an opcode that identifies a type of command, and wherein a value of the opcode is identical to the plurality of processes; and generating a plurality of sideband signals, wherein one sideband signal of the plurality of sideband signals is generated for each of the plurality of processes, wherein the plurality of sideband signals includes a first sideband signal for a first process of the plurality of processes and a second sideband signal for a second process of the plurality of processes, and wherein the first sideband signal is different from the second sideband signal.

11. The information processing system according to claim 9, wherein the command further comprises address information as an operand, and wherein a signal line of the storage device is divided into an opcode signal line for transmission of the opcode and an address signal line for transmission of the address information.

12. The information processing system according to claim 9, wherein the command generating unit is further configured to add the opcode and the one sideband signal.

* * * * *